July 7, 1970 B. TOPAS 3,519,506

HIGH VOLTAGE SEMICONDUCTOR DEVICE

Original Filed Nov. 26, 1963

INVENTOR.
BENJAMIN TOPAS

BY

OSTROLENK, FABER, GERB & SOFFEN

United States Patent Office 3,519,506
Patented July 7, 1970

3,519,506
HIGH VOLTAGE SEMICONDUCTOR DEVICE
Benjamin Topas, Santa Monica, Calif., assignor to International Rectifier Corporation, El Segundo, Calif., a corporation of California Original application Nov. 26, 1963, Ser. No. 325,872, now Patent No. 3,320,496. Divided and this application Mar. 9, 1967, Ser. No. 646,773
Int. Cl. C23f *1/02;* H01l *7/50*
U.S. Cl. 156—11 2 Claims

ABSTRACT OF THE DISCLOSURE

The process for etching a shaped groove in a semiconductor wafer in which an annular surface area on the top of the wafer is exposed and a groove is initially etched therethrough. The mask in the center of the annular groove is then reduced in diameter and a second etching operation causes the groove to cut through a junction extending through the wafer, and causes the interior surface of the annular groove to form an acute angle.

This application is a division of application Ser. No. 325,872, filed Nov. 26, 1963, in the name of Benjamin Topas, entitled High Voltage Semiconductor Device, now U.S. Pat. 3,320,496, and assigned to the assignee of the present invention.

This invention relates to a novel semiconductor structure and method of manufacture thereof for the formation of junctions capable of withstanding high reverse voltages.

More specifically, and in accordance with the present invention, a novel etching process is used to etch the edge of the effective junction of a semiconductor device whereby the edge of the device forms an angle less than 90° with respect to the plane of the junction and a long distance is formed between the metallic electrodes of the device.

In the case of high voltage semiconductor devices, there is an aggravated problem of creepage and tracking across the edge surface of the wafer. In accordance with the present invention, the edge surface of the wafer is caused to have an angle of less than 90° with respect to the plane of the junction to thereby broaden the gap between layers and provide a longer and clean surface which is more resistant to creepage and tracking. This reduces the surface field such that the bulk avalanche break-down always occurs prior to a surface break-down. Thus, the reverse voltage withstanding ability of the junction is increased.

Moreover, and in accordance with a further feature of the invention, the shaping is carried out by forming an annular groove around the periphery of the wafer, but which does not extend completely through the wafer. In this manner, a longer surface creepage distance is provided between the metallic electrodes of the device and before hermetic sealing.

Accordingly, a primary object of this invention is to provide a novel improved high voltage semiconductor device.

A further object of this invention is to increase the creepage distance across the effective edge of a wafer.

Yet another object of this invention is to increase the effective distance between the metallic electrodes of a semiconductor device.

A still further object of this invention is to provide a novel method of manufacture for high voltage semiconductor devices.

These and other objects of this invention will become apparent from the following description when taken in connection with the drawings, in which.

Figure 2:
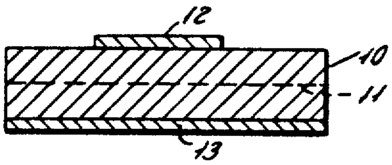
FIG. 2 is a cross-sectional view of FIG. 1 taken across the lines 2—2 in FIG. 1.
Figure 1:
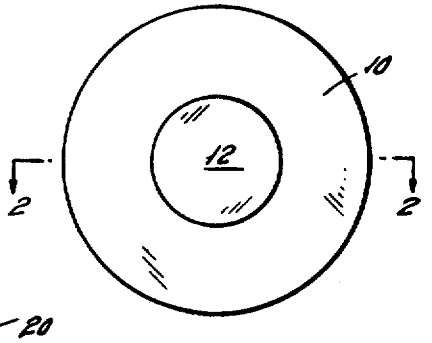
FIG. 1 is a top view of a wafer which has metallic electrodes thereon, and is to be treated in accordance with the present invention.

Referring first to FIGS. 1 and 2, I have shown therein a semiconductor wafer 1 which could, for example, be of silicon, and could have a junction 11 therein formed between an N-type lower surface and P-type upper surface. Alternatively, the upper surface could be N and the lower surface P. It is to be particularly understood that while I have illustrated the invention for the case of a semiconductor device having a single junction 11, a device having any number of junctions could have been presented herein. For the case of the illustrative wafer, however, it may be presumed that the junction 11 is formed between a lower N-type body and upper P-type body, and can be formed in any desired manner as by diffusion, alloying, epitaxial techniques, and so on.

The wafer is further shown to have formed thereon upper and lower electrodes 12 and 13 which could be applied to the wafer in any desired manner.

For purposes of illustration, the wafer of FIGS. 1 and 2, could, for example, have a diameter of 700 mils and a thickness, for example, of 14 mils. The resistivity of the material may be of any desired value, depending upon the end use of the product.

The object of the present invention is to operate upon the wafer of FIGS. 1 and 2 in such a manner as to shape the ends of junction 11 to cause the junction to have improved reverse voltage characteristics and to provide an increased effective distance between the junction and any metallic parts such as electrodes 12 and 13.

Figure 3:
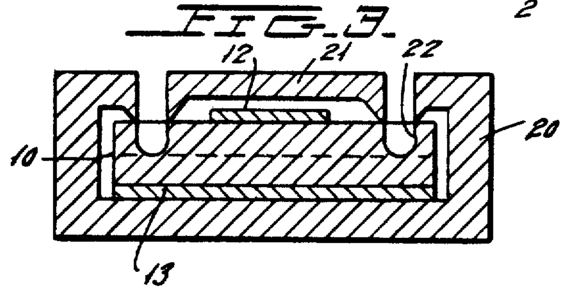
FIG. 3 illustrates the wafer of FIG. 2 contained within a jig and subjected to a first etching operation to form a first portion of an annular groove.

The wafer is initially cleaned in a suitable manner, and is thereafter assembled within a jig o fthe type shonw in FIG. 3. More specifically, the jig of FIG. 3 includes a first masking section 20 of suitable acid-resistant material such as Teflon (polytetrafluoroethylene) which completely encloses the sides and bottom of the wafer along with a small annular region of the wafer extending in from the edge thereof. By way of example, the diameter of the opening of jig 20 may be 620 mils so that an annular band having a radial thickness of 40 mils extending inwardly from the edge of the wafer is covered. A second mask 21 is then applied to cover or mask a central area of the upper surface of the wafer which could, for example, have a diameter of 560 mils. It is to be noted that the external mask 20 could be replaced by any suitable masking medium which would prevent an etching material from contacting any of the surface covered by the jig 20. The mask 21, however, is preferably an easily removable masking structure since, as will be seen more fully hereinafter, it must be quickly removed and replaced by a smaller diameter mask during a subsequent step of the etching operation.

Once the wafer is suitably masked, as illustrated in FIG. 3, the wafer is dipped into an etching compound which will cause the etching of an annular groove 22 which extends just through the junction 11, as illustrated. By way of example, the junction 11 could be 3½ mils beneath the upper surface of wafer 10 so the first etch can extend to about 4 mils in depth. A typical etching medium is formed of three parts nitric acid, one part hydrofluoric acid and one part acetic acid. The groove 22 will be etched in approximately 4 minutes at room temperature. Clearly, this time is controlled by the exact location of junction 11 within the wafer and thus the depth to which the etch must extend.

Figure 4:
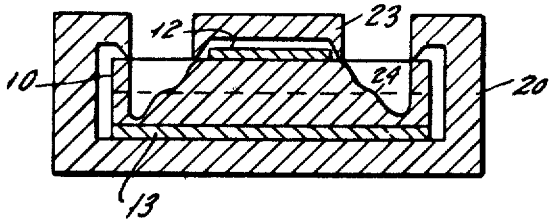
FIG. 4 illustrates the wafer of FIG. 3 contained within a second jig structure for the completion of the etching operation.
Figure 7:
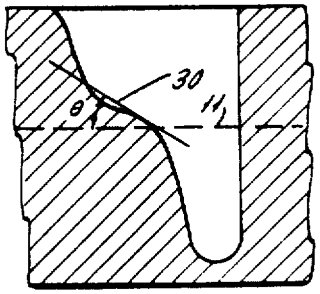
FIG. 7 shows an enlarged view of the groove of FIG. 5.

Thereafter, the wafer and jig are quickly removed from the etching medium, and the upper mask 21 is removed and replaced by a second mask 23, as illustrated in FIG. 4. The mask 23 of FIG. 4 will have a diameter, for example, of 425 mils and the newly masked structure is then returned to the etching medium. After approximately 2½ minutes at room temperature, the new groove 24 will be formed wherein the newly exposed regions of semiconductor material will now be etched to assume the shape as shown in FIG. 4, and particularly as shown in FIG. 7. It is to be specifically noted that this etch is stopped prior to the complete etch through the wafer 10 so that the lower elecrode 13 is not exposed to the etch. By way of example, the thickness of wafer 10 left at the base of wafer 24 could be 1 mil.

The specific angle $\theta$ formed by line 30 in FIG. 7 with respect to the plane of junction 11 depends on the resistivity of the material used, which, in turn, determines avalanche break-down voltage, and the desired rated voltage of the device. Higher resistivities will give a greater spacer charge spread for a given voltage so the angle $\theta$ preferably decreases as resistivity increases so the surface field is correspondingly reduced. For example, for a 40 ohm centimeter resistivity, avalanche break-down is at the order of 1500 volts and an angle $\theta$ of the order of 45° would be used.

Once the second etch is completed, the wafer is removed from the etching compound, and is washed and cleaned with distilled water at room temperature. Thereafter, a final cleaning operation with distilled water is used.

Figure 5:
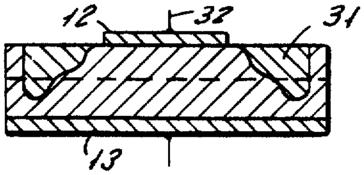
FIG. 5 shows the finished wafer after the operation of FIG. 4 and the placement of varnish in the finished groove.
Figure 6:
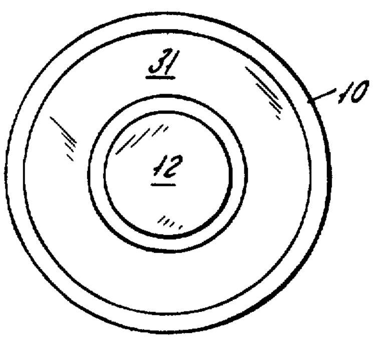
FIG. 6 is a top view of FIG. 5.

It is to be further noted thta the final product, as shown in FIG. 5, is one in which there will be very low surface leakage across the effective edge of the wafer which is the inner diameter of groove 24, because of the novel shaping operation which gives a smooth and clean surface. Moreover, this surface is completely isolated from the lower metallic electrode 13 by virtue of the remaining wafer rim section external of groove 24. Moreover, the novel contoured surface has been found to have considerably improved reverse voltage-withstanding capability.

After the successful formation of groove 24, the finished wafer may be coated with a suitable varnish which fills the groove 24, as illustrated by the varnish 31 in FIG. 5. This coating step may be eliminated where the wafer can be subsequently mounted in a suitably inert atmosphere. Thereafter, the wafer may be assembled into a completed device having terminals 32 and 33 applied to electrodes 12 and 13 and the device encased in a suitable housing.

Although this invention has been described with respect to its preferred embodiments, it will now be understood that many variations and modifications will be obvious to those skilled in the art, and it is preferred, therefore, that the scope of the invention be limited not by he specific disclosure herein but only by the appended claims.

The embodiments of the invention in which an exclusive privilege or property is claimed are defined as follows:

1. The method of treating a wafer of semiconductor material having a junction therein comprising the steps of masking the bottom surface, sides and outer periphery of the top surface of said wafer and an inner surface area of the top surface of said area, leaving an exposed annular area at the top of said wafer, exposing said masked annular groove extending from the exposed annular area of said top surface of said wafer, removing and replacing said mask on said inner surface area with a smaller area mask to expose an increased annular area at the top of said wafer, and exposing said newly masked wafer to a second etching step to continue to etch said annular groove and terminating said second etching step before said groove reaches said bottom surface of said wafer and after the walls of said groove form a predetermined angle at the point at which they intersect said junction and thereafter washing said wafer.

2. The method of claim 1 wherein said first etching step is discontinued only after said groove reaches said junction.

References Cited

UNITED STATES PATENTS 3,164,500 1/1965 Benda ............ 148—186
3,179,543 4/1965 Marcelis ............ 156—11

JACOB H. STEINBERG, Primary Examiner

U.S. Cl. X.R.

56—17